US012744534B2

(12) United States Patent
Rosingana et al.

(10) Patent No.: US 12,744,534 B2
(45) Date of Patent: Sep. 22, 2026

(54) SHOCK RECOVERY

(71) Applicant: STMicroelectronics International N.V., Geneva (CH)

(72) Inventors: Paolo Rosingana, Savigliano (IT); Matteo Quartiroli, Certosa di Pavia (IT)

(73) Assignee: STMicroeletronics N.V., Geneva (CH)

( * ) Notice: Subject to any disclaimer, the term of this patent is extended or adjusted under 35 U.S.C. 154(b) by 208 days.

(21) Appl. No.: 18/643,697

(22) Filed: Apr. 23, 2024

(65) Prior Publication Data

US 2025/0330182 A1 Oct. 23, 2025

(51) Int. Cl.
*H03L 7/08* (2006.01)
*G01P 15/18* (2013.01)
*G06F 1/08* (2006.01)

(52) U.S. Cl.
CPC ................ *H03L 7/08* (2013.01); *G01P 15/18* (2013.01); *G06F 1/08* (2013.01)

(58) Field of Classification Search
None
See application file for complete search history.

(56) References Cited

U.S. PATENT DOCUMENTS

2011/0146403 A1 6/2011 Rizzo Piazza Roncoroni et al.
2015/0226556 A1 8/2015 Aaltonen
2015/0226557 A1* 8/2015 Aaltonen ........... G01C 19/5776 73/504.12
2016/0161256 A1 6/2016 Lee et al.
2016/0226500 A1 8/2016 Zhao
2017/0257105 A1 9/2017 Patrizi
2019/0257655 A1* 8/2019 Tsukamoto ......... G01P 15/0802
2023/0273024 A1 8/2023 Fang et al.

FOREIGN PATENT DOCUMENTS

CN 114199221 B 4/2023
JP 2016082383 A 5/2016

OTHER PUBLICATIONS

Extended European Search Report, EP Application No. 25169030.1-1201, mailed Sep. 22, 2025, 5 pages.

* cited by examiner

*Primary Examiner* — Cassandra F Cox
(74) *Attorney, Agent, or Firm* — Slater Matsil, LLP

(57) ABSTRACT

A shock recovery circuit is disclosed. The circuit includes a phase locked loop (PLL) monitor circuit configured to receive at least one of a PLL input clock and a PLL feedback clock, and to generate a PLL status signal based on at least one of the PLL input clock and the PLL feedback clock, the PLL status signal indicating whether a shock event has occurred; an acceleration monitor circuit configured to receive acceleration data, and to generate an acceleration status signal based on the acceleration data, the acceleration status signal indicating whether the shock event has occurred; and a controller, configured to receive the PLL status signal and the acceleration status signal, generate an enable signal indicating whether a mechanical oscillating sensor generating the PLL input clock is to operate, and generate a multiplexer signal indicating whether a system clock is to be generated based on the PLL feedback clock.

20 Claims, 4 Drawing Sheets

SHOCK RECOVERY

TECHNICAL FIELD

The present disclosure generally relates to a clock generation circuit, as well as to methods for recovering from a mechanical shock.

BACKGROUND

Some electronic systems benefit from clock generation circuits which generate system clocks. The system clock of a system may be used by many components to perform their respective data manipulation and calculation functions. Some system clock generation circuits use oscillations of mechanical components to generate system clocks. Such system clock generation circuits are susceptible to system clock failure as a result of mechanical shocks.

SUMMARY

One embodiment is a shock recovery circuit, including a phase locked loop (PLL) monitor circuit, the PLL monitor circuit configured to receive at least one of a PLL input clock and a PLL feedback clock, and to generate a PLL status signal based on at least one of the PLL input clock and the PLL feedback clock, the PLL status signal indicating whether a shock event has occurred; an acceleration monitor circuit, the acceleration monitor circuit configured to receive acceleration data, and to generate an acceleration status signal based on the acceleration data, the acceleration status signal indicating whether the shock event has occurred; and a controller, configured to receive the PLL status signal and the acceleration status signal, generate an enable signal indicating whether a mechanical oscillating sensor generating the PLL input clock is to operate, and generate a multiplexer signal indicating whether a system clock is to be generated based on the PLL feedback clock.

Another embodiment is a clock generation system, including an oscillator circuit configured to electronically generate an oscillator clock; a mechanical oscillating sensor including a mechanical oscillator, and configured to generate a PLL input clock; a phase locked loop (PLL) configured to receive the PLL input clock, and to generate a PLL clock and a PLL feedback signal based on the PLL input clock; a clock multiplexer configured to conditionally connect the PLL clock and the oscillator clock to an output for a system clock; an acceleration sensor configured to sense an acceleration in each of one, two or three orthogonal spatial dimensions, and to generate acceleration measurements for each of the sensed spatial dimensions; and a shock recovery circuit, configured to receive one or more of the PLL input clock, the PLL feedback signal, and the acceleration measurements, and to generate a multiplexor control signal configured to cause the clock multiplexer to connect a particular one of the PLL clock and the oscillator clock to the output based on one or more of the PLL input clock, the PLL feedback signal, and the acceleration measurements, where the multiplexor control signal causes the clock multiplexer to connect the oscillator clock to the output in response to one or more of the received PLL input clock, the received PLL feedback signal, and the received acceleration measurements indicating a shock event.

Another embodiment is a method of using a clock generation system, the method including generating an oscillator clock; generating a PLL input clock; generating a PLL clock based on the PLL input clock; generating a system clock based on the PLL clock; monitoring the PLL clock; generating a PLL status signal based on the monitored PLL clock; monitoring an acceleration of the clock generation system, and generating an acceleration status signal based on the monitored acceleration; in response to one or more of the PLL status signal and the acceleration status signal indicating a shock event, generating the system clock based on the oscillator clock; and after a delay, generating the system clock based on the PLL clock, where the delay starts with generating the system clock based on the oscillator clock.

BRIEF DESCRIPTION OF THE DRAWINGS

For a more complete understanding of one or more embodiments of the present disclosure, and the advantages thereof, reference is now made to the following descriptions taken in conjunction with the accompanying drawings, in which.

Figure 1:
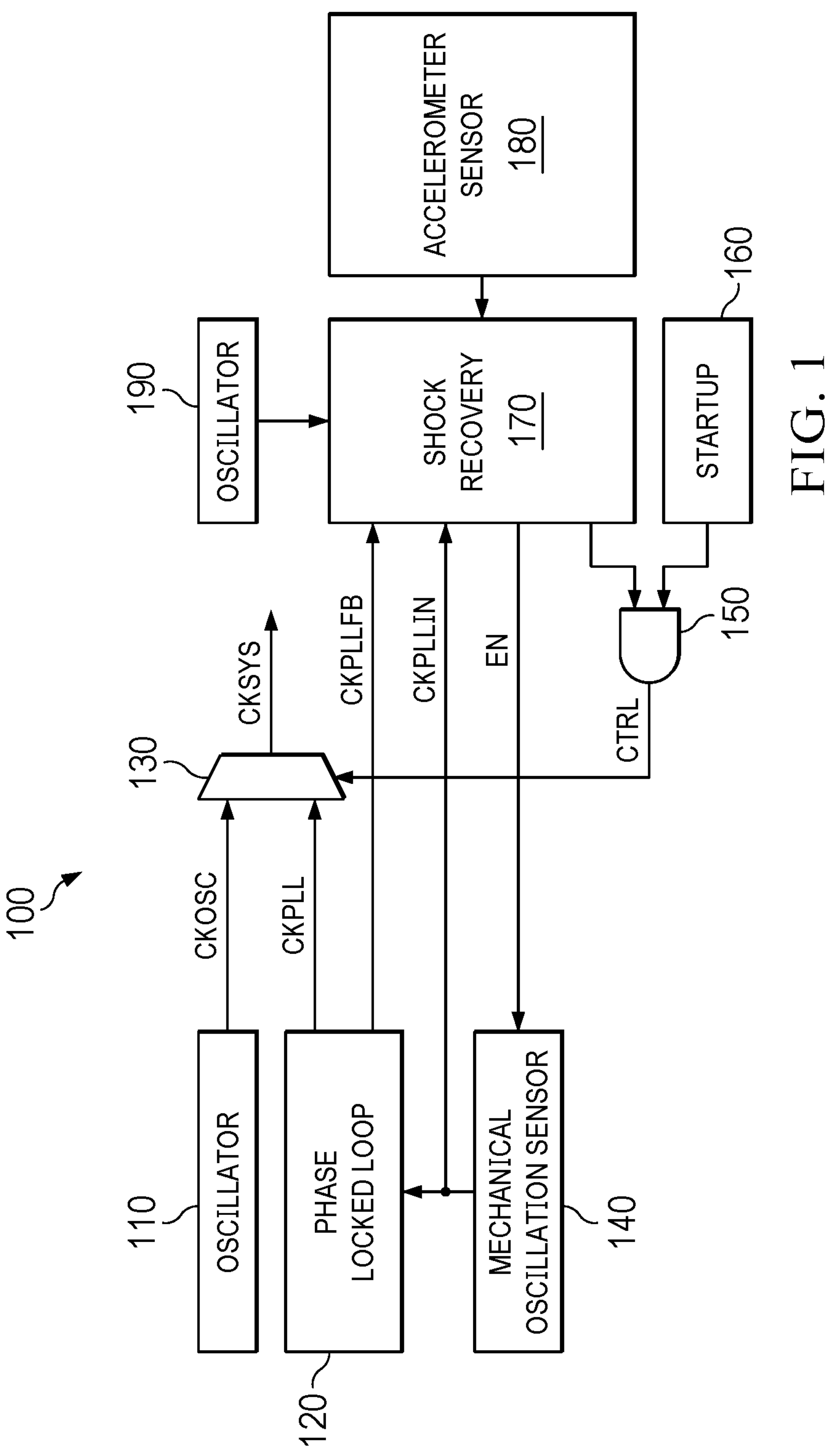
FIG. 1 shows a schematic circuit diagram of a clock generation system according to some embodiments.

Corresponding numerals and symbols in the different figures generally refer to corresponding parts unless otherwise indicated. The figures are drawn to illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

Illustrative embodiments of the system and method of the present disclosure are described below. In the interest of clarity, all features of an actual implementation may not be described in this specification. It will of course be appreciated that in the development of any such actual embodiment, numerous implementation-specific decisions may be made to achieve the developer's specific goals, such as compliance with system-related and business-related constraints, which will vary from one implementation to another. Moreover, it should be appreciated that such a development effort might be complex and time-consuming but would nevertheless be a routine undertaking for those of ordinary skill in the art having the benefit of this disclosure.

Reference may be made herein to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

The embodiments discussed herein illustrate various aspects of clock generation circuit technology which use mechanical elements to generate a system clock, and which provide effective recovery from mechanical shock events which disturb the generated system clock.

Systems in which a mechanical oscillating sensor, such as a gyroscope is present, use oscillations of the oscillating sensor as a time-base reference and a PLL generates a system clock for use by other components of the systems. In some embodiments, when the mechanical oscillating sensor is turned on, the timing of the operation of other sensors, such as accelerometers and shock sensors is synchronized with the timing of the mechanical oscillating sensor.

In some embodiments, a local (electronic) oscillator may be included in the system, for example, so that it may be used when, for example, the mechanical oscillating sensor is off or during its start-up phases.

Events like shock events (impulsive accelerations, e.g. short-time and high amplitude) can disturb mechanical oscillating sensor drive loop and stop or momentarily distort mechanical oscillations. As a result, the system clock may be disturbed and cause a system freeze or cause the system clock to be out of specification. These results are preferably avoided, for example, if other components or sensors are to continue to work properly.

In some embodiments, a shock recovery controller can monitor signals from a PLL (e.g. input frequency, Duty-Cycle and phase shift between input and feedback) to detect precursory signs of distorted oscillations. The shock recovery controller may additionally or alternatively monitor shock data from a High-g accelerometer in order to detect precursory signs of distorted oscillations. The shock recovery controller may cause the system clock generation circuit to enter a safe mode before the problematic effects of the shock event affect the system. In some embodiments, when in the safe mode, the clock source for the system clock is switched from the PLL to an internal oscillator. In some embodiments, a forcing or enable signal for the mechanical oscillating sensor is terminated and/or a mass brake signal is generated to keep the mechanical oscillating sensor in a safe condition.

In some embodiments, the advantageous aspects are implemented as a digital circuit system that can be implemented in an inexpensive way (e.g. with 0.6 kgates) and can be left always on since its power consumption is negligible with respect to overall power required by the mechanical oscillating sensor.

In some embodiments, the system clock generator avoids system freeze and data discontinuity in accelerometers. In some embodiments, multiple parameters are continuously monitored in order to anticipate impending system shock event effects. As a result, it becomes possible to anticipate shock event effects on sensors in a MEMS device embedded with a mechanical oscillating sensor, and switch to a local electrical oscillator source that permits the system to be in a safe state and continue to work, for example, while the mechanical oscillating sensor clock generation system recovers from the anticipated shock event.

FIG. 1 shows a schematic circuit diagram of a clock generation system 100 according to some embodiments. Clock generation system 100 includes oscillator circuit 110, phase locked loop (PLL) 120, clock multiplexer 130, mechanical oscillating sensor 140, AND gate 150, mechanical oscillating sensor startup controller 160, shock recovery circuit 170, accelerometer sensor 180, and high-frequency oscillator circuit 190. Clock generation system 100 is a particular example of a circuit implementing various aspects of the specification. Other examples are contemplated.

Oscillator circuit 110 may be any electronic oscillator circuit configured to generate an oscillator clock suitable for use as a system clock. For example, oscillator circuit 110 may include any of a number of clock generation circuits, such as a ring oscillator, a PLL, a delay line, etc.

PLL 120 may be any phase locked loop circuit or delay locked loop circuit configured to generate an output clock suitable for use as a system clock, where the output clock is generated based on a difference between an input clock reference and a feedback clock generated based on the output clock. As illustrated, in this embodiment, PLL 120 receives an oscillation signal CKPLLIN from mechanical oscillating sensor 140 as an input clock reference. In addition, PLL 120 is configured to generate a PLL clock CKPLL as its output clock. PLL 120 also generates a feedback clock CKPLLFB which it uses internally to synchronize PLL clock CKPLL with the oscillation signal CKPLLIN.

Clock multiplexer 130 may be any multiplexing circuit configured to generate or transmit an output clock based on first and second input clocks according to a selection control signal. As illustrated, in this embodiment, clock multiplexer 130 receives the oscillator clock CKOSC from oscillator circuit 110 as a first input clock, and receives the PLL clock CKPLL from PLL 120 as a second input clock. In addition, clock multiplexer 130 receives a selection control signal CTRL from AND gate 150, and generates or transmits a system clock CKSYS based on, similar to, or identical to one of the oscillator clock CKOSC and the PLL clock CKPLL according to the state of the selection control signal CTRL.

Mechanical oscillating sensor 140 is configured to receive an enable signal EN from shock recovery circuit 170. In addition, mechanical oscillating sensor 140 has a drive circuit which is configured to conditionally cause mechanical oscillating sensor 140 to generate and oscillating output signal according to the state of the enable signal EN.

In response to the enable signal EN indicating that the mechanical oscillating sensor 140 is to operate, the drive circuit causes mechanical oscillating sensor 140 to generate the oscillation signal CKPLLIN received by PLL 120. In some embodiments, the oscillation signal CKPLLIN is generated based on a mechanical mass which oscillates, and an electronic sensor generates the oscillation signal CKPLLIN based on one or more sensed positions of the oscillating mechanical mass.

In response to the enable signal EN indicating that the mechanical oscillating sensor 140 is to not operate, the drive circuit causes mechanical oscillating sensor to not generate the oscillation signal CKPLLIN. For example, the output of the mechanical oscillating sensor 140 may be fixed, for example, in a high or a low state. In some embodiments, in response to the enable signal EN indicating that the mechanical oscillating sensor 140 as to not operate, the mechanical mass of mechanical oscillating sensor 140 is fixed to prevent or substantially prevent movement of the mechanical mass.

Shock recovery circuit 170 receives the oscillation signal CKPLLIN, the feedback clock CKPLLFB, acceleration data values from accelerometer sensor 180, and a high-frequency clock from high-frequency oscillator circuit 190, and generates the enable signal EN based at least partly on the oscillation signal CKPLLIN, the feedback clock CKPLLFB, the acceleration data values, and the high-frequency clock.

In some embodiments, shock recovery circuit 170 generates an enable signal EN causing the mechanical oscillating sensor 140 to not operate if the acceleration data values from accelerometer sensor 180 indicate that clock generation system 100 has experienced a shock event or acceleration which is greater than a threshold, as described in more detail below.

In some embodiments, shock recovery circuit 170 generates an enable signal EN causing the mechanical oscillating sensor 140 to not operate if the oscillation signal CKPLLIN and the feedback clock CKPLLFB collectively indicate or suggest that the mechanical oscillating sensor 140 has experienced a shock event or acceleration which has disturbed the oscillation signal CKPLLIN, as described in more detail below.

In some embodiments, absent acceleration data values indicating that clock generation system 100 is experienced the shock event or acceleration and absent anomalies in the oscillation signal CKPLLIN and the feedback clock signal CKPLLFB collectively indicating or suggesting that the mechanical oscillating sensor 140 has experienced a shock event or acceleration which has disturbed the oscillation signal CKPLLIN, shock recovery circuit 170 generates an enable signal EN causing the mechanical oscillating sensor 140 to operate.

In the illustrated embodiment, shock recovery circuit 170 additionally generates a first mux control signal for AND gate 150 indicating that the system clock CKSYS may be generated based on the PLL clock CKPLL instead of the oscillator clock CKOSC. In some embodiments, shock recovery circuit 170 generates the first mux control signal in response to a predetermined delay beginning with the enable signal EN changing to a state indicating that mechanical oscillating sensor 140 is to operate.

Mechanical oscillating sensor startup controller 160 generates a second mux control signal for AND gate 150 indicating that the system clock CKSYS may be generated based on the PLL clock CKPLL instead of the oscillator clock CKOSC. In some embodiments, mechanical oscillating sensor startup controller 160 generates the second mux control signal after a predetermined delay beginning with a startup of mechanical oscillating sensor 140, for example, initiated by in some embodiments, one or more startups of mechanical oscillating sensor 140 may be initiated by other signals, such as a system startup signal, or a power up signal.

In some embodiments, AND gate 150 generates a selection control signal CTRL having a state indicating that the system clock CKSYS is to be generated based on the oscillator clock CKOSC if either of the first and second mux control signals do not indicate that the system clock CKSYS may be generated based on the PLL clock CKPLL. In some embodiments, AND gate 150 generates a selection control signal CTRL having a state indicating that the system clock CKSYS is to be generated based on the PLL clock CKPLL if both of the first and second mux control signals indicate that the system clock CKSYS may be generated based on the PLL clock CKPLL.

Accelerometer sensor 180 senses acceleration of clock generation system 100. For example, accelerometer sensor 180 be any accelerometer configured to generate a series of acceleration measurements in each of 1, 2, or 3 spatial dimensions. In some embodiments, accelerometer sensor 180 senses and generates acceleration measurements for spatial dimensions corresponding with those spatial dimensions of the mechanical mass of the mechanical oscillating sensor 140. For example, in some embodiments, accelerometer sensor 180 generates acceleration measurements for spatial dimensions, in which sufficient acceleration is likely to disturb the oscillation operation of the mass of the mechanical oscillating sensor 140.

High-frequency oscillator circuit 190 generates a clock signal for shock recovery circuit 170 having characteristics, such as, for example, frequency and/or phase performance which allow shock recovery circuit 170 to suitably generate the enable signal EN, as discussed in further detail below. In some embodiments, high-frequency oscillator circuit 190 is incorporated in oscillator circuit 110.

Figure 2:
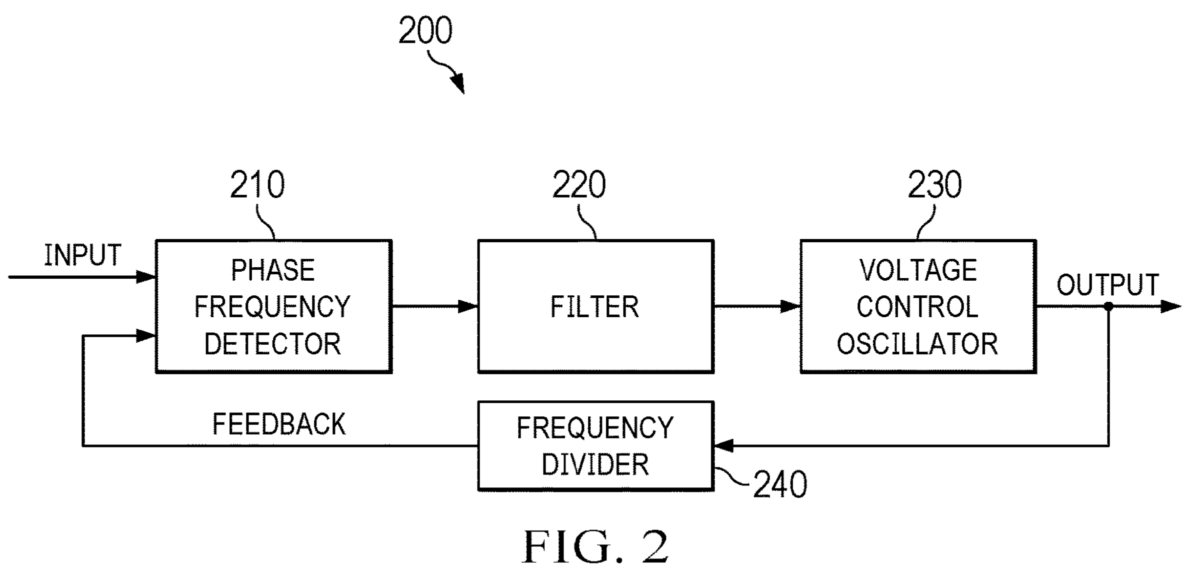
FIG. 2 shows a block diagram of a phase locked loop (PLL) circuit according to some embodiments.

FIG. 2 shows a block diagram of a phase locked loop (PLL) circuit 200 according to some embodiments. PLL circuit 200 includes phase frequency detector 210, filter 220, voltage control oscillator (VCO) 230, and frequency divider 240. PLL circuit 200 may, for example, be used as PLL 120 of clock generation system 100. In some embodiments, PLL 120 of clock generation system 100 uses a different PLL circuit.

Phase frequency detector 210 receives an input clock and a feedback clock, and generates one or more signals for filter 220 based on, for example, a difference in phase between the input clock and the feedback clock.

Filter 220 receives the signals from phase frequency detector 210 and generates a voltage output for VCO 230. In some embodiments, phase frequency detector 210 and filter 220 are configured so that a clock edge of the input clock preceding a corresponding clock edge of the feedback clock causes the voltage output for VCO 230 generated by filter 220 to increase the frequency of the output clock generated by VCO 230. Similarly, in some embodiments, phase frequency detector 210 and filter 220 are configured so that a clock edge of the feedback clock preceding a corresponding clock edge of the input clock causes the voltage output for VCO generated by filter 220 to decrease the frequency of the output clock generated by VCO 230.

Frequency divider 240 receives the output clock generated by VCO 230 and generates the feedback clock for phase frequency detector 210. In some embodiments, the frequency of the feedback clock is a particular fraction of the frequency of the output clock, for example, such that the frequency of the input clock is the particular fraction of the frequency of the output clock.

When used in a clock generation system such as clock generation system 100, the feedback clock is provided as an output of PLL circuit 200. When used in clock generation system 100, the feedback clock may be used as feedback clock CKPLLFB. In embodiments of clock generation system 100 using a different PLL circuit for PLL 120, another suitable feedback clock may be used as feedback clock CKPLLFB.

Figure 3:
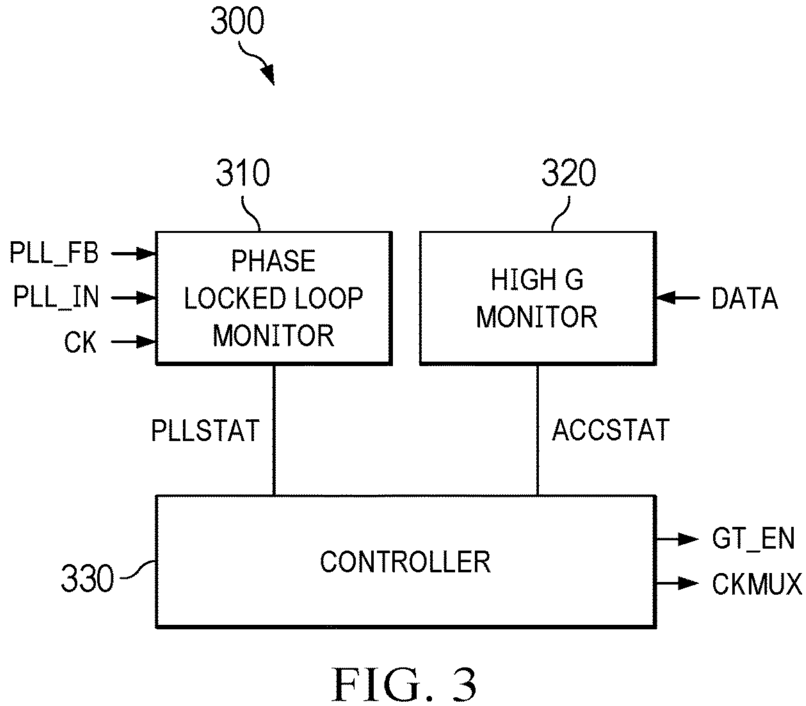
FIG. 3 shows a schematic circuit diagram of a mechanical shock recovery circuit according to some embodiments.

FIG. 3 shows a schematic circuit diagram of a shock recovery circuit 300 according to some embodiments. Shock recovery circuit 300 includes PLL monitor circuit 310, acceleration monitor 320, and controller 330. Shock recovery circuit 300 may be used as shock recovery circuit 170 of clock generation system 100. In some embodiments, clock generation system 100 uses other shock recovery circuits for example, having aspect similar or identical to those of shock recovery circuit 300.

PLL monitor circuit 310 receives first and second input clocks. For example, in some embodiments, PLL monitor circuit 310 receives a PLL input clock PLL_IN, a PLL feedback clock PLL_FB. PLL monitor circuit 310 could also receive a high-frequency clock input CK. In some embodiments, based on the PLL input clock PLL_IN and the PLL feedback clock PLL_FB, PLL monitor circuit 310 generates a PLL status signal PLLSTAT for controller 330 indicating one or more status conditions of the PLL input clock PLL_IN, for example, as discussed in more detail below with reference to FIG. 4.

In some embodiments, controller 330 generates an enable signal EN causing the mechanical oscillating sensor to not operate if the PLL status signal PLLSTAT indicates or suggests that the mechanical oscillating sensor has experienced a shock event or acceleration which has disturbed the PLL input clock PLL_IN, for example, as described in more detail below.

In some embodiments, absent the PLL status signal PLLSTAT indicating or suggesting that the mechanical oscillating sensor has experienced a shock event or acceleration which has disturbed the PLL input clock PLL_IN, controller 330 generates an enable signal EN causing or allowing the mechanical oscillating sensor to operate.

Acceleration monitor 320 receives acceleration data values DATA. In some embodiments, acceleration monitor 320 also receives a clock signal (not shown). In some embodiments, based on the acceleration data values DATA, and optionally based on the clock signal, acceleration monitor 320 generates an acceleration status signal ACCSTAT for controller 330 indicating one or more status conditions of the acceleration of a mechanical oscillating sensor used to generate the PLL input clock PLL_IN, for example, as discussed in more detail below with reference to FIG. 5.

In some embodiments, controller 330 generates an enable signal EN causing the mechanical oscillating sensor to not operate if the acceleration status signal ACCSTAT indicates or suggests that the mechanical oscillating sensor has experienced a shock event or acceleration which has disturbed the PLL input clock PLL_IN, for example, as described in more detail below.

In some embodiments, absent the acceleration status signal ACCSTAT indicating or suggesting that the mechanical oscillating sensor has experienced a shock event or acceleration which has disturbed the PLL input clock PLL_IN, controller 330 generates an enable signal EN causing or allowing the mechanical oscillating sensor to operate.

In some embodiments, controller 330 generates a mux control signal CKMUX, for example, to control a selection multiplexer, where the mux control signal CKMUX indicates that a system clock may be generated based on the PLL clock input PLL_IN instead of an oscillator clock. In some embodiments, controller 330 generates the mux control signal CKMUX in response to a predetermined delay beginning with the enable signal EN changing to a state indicating that the mechanical oscillating sensor is to operate.

Figure 4:
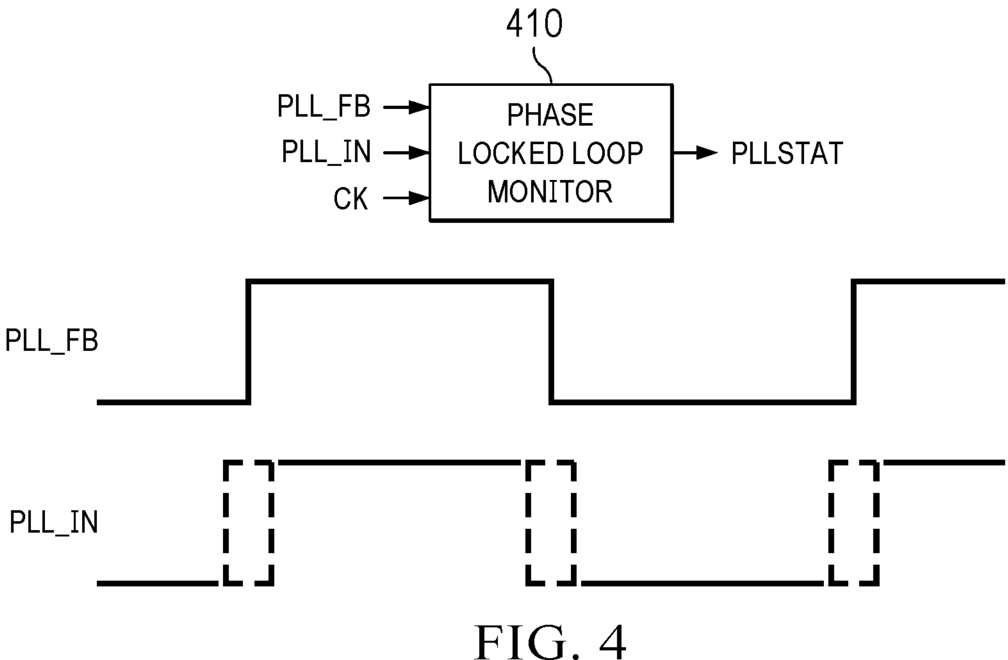
FIG. 4 shows a schematic circuit diagram of a PLL monitor circuit according to some embodiments.

FIG. 4 shows a schematic circuit diagram of a PLL monitor circuit 410 according to some embodiments. PLL monitor circuit 410 may be used as PLL monitor circuit 310 in shock recovery circuit 300. In some embodiments, shock recovery circuit 300 uses another PLL monitor circuit, for example, having characteristics similar or identical to those of PLL monitor circuit 400.

In some embodiments, PLL monitor circuit 410 receives at least one of first and second clocks. For example, PLL monitor circuit 410 may receive PLL_IN clock as a first input clock the PLL_IN clock. In some embodiments, PLL monitor circuit 410 may receive the PLL_FB clock as a second input clock. In some embodiments, PLL monitor circuit 410 may also receive a high-frequency clock input CK. In some embodiments, based on at least one of the PLL input clock PLL_IN and the PLL feedback clock PLL_FB, PLL monitor circuit 410 generates a PLL status signal PLLSTAT indicating one or more status conditions of the PLL input clock PLL_IN. The PLLSTAT signal may be generated based on one or more of a set of detected characteristics or parameters.

In some embodiments, the PLLSTAT signal may be generated based at least partly on a duty cycle of the PLL_IN clock. For example, while the circuit is functioning without shock events, the PLL_IN clock has a particular expected duty cycle. For example, the expected duty cycle may be 50%, where the high time of the PLL_IN clock is 50% of the period of the PLL_IN clock. In some embodiments, the expected duty cycle is different from 50%. PLL monitor circuit 410 may include a duty cycle monitoring circuit configured to monitor the duty cycle of the PLL_IN clock based on the received PLL_IN clock and the received high-frequency clock input CK, and if the monitored duty cycle varies from the expected duty cycle by more than a threshold, the duty cycle monitoring circuit may generate a duty cycle alert signal indicating that a shock event may have occurred in response to the monitored duty cycle having varied from the expected duty cycle by more than a threshold. The threshold may be about one of 0.5%, 0.6%, 0.7%, 0.8%, 0.9%, 1.0%, 1.1%, 1.2%, 1.3%, 1.4%, 1.5%, or another %. In some embodiments, the threshold is configurable, for example, during a test operation or during a calibration operation. In some embodiments, the threshold for generating the duty cycle alert signal when the monitored duty cycle is greater than the expected duty cycle is different from the threshold for generating the duty cycle alert signal when the monitored duty cycle is less than the expected duty cycle.

In some embodiments, the PLLSTAT signal may be generated based at least partly on a change rate of the duty cycle of the PLL_IN clock. For example, while the circuit is functioning without shock events, the PLL_IN clock has a particular expected rate of change in its duty cycle, such as a mean rate change. For example, the expected rate of change in the duty cycle may be 1%/us. In some embodiments, the expected duty cycle change rate is different than 1%/us. PLL monitor circuit 410 may include a duty cycle change rate monitoring circuit configured to monitor the duty cycle change rate of the PLL_IN clock based on the received PLL_IN clock and the received high-frequency clock input CK, and if the monitored duty cycle change rate is greater than the expected duty cycle change rate by more than a threshold, the duty cycle change rate monitoring circuit may generate a duty cycle change rate alert signal indicating that a shock event may have occurred in response to the monitored duty cycle change rate having varied from the expected duty cycle change rate by more than a threshold. The threshold may be about one of 0.5%, 0.6%, 0.7%, 0.8%, 0.9%, 1.0%, 1.1%, 1.2%, 1.3%, 1.4%, 1.5%, or another %. In some embodiments, the threshold is configurable, for example, during a test operation or during a calibration operation.

In some embodiments, the PLLSTAT signal may be generated based at least partly on a period the PLL_IN clock. For example, while the circuit is functioning without shock events, the PLL_IN clock has a particular expected period. For example, the expected period may be 40 us. In some embodiments, the expected period is different from 40 us. PLL monitor circuit 410 may include a period monitoring circuit configured to monitor the period of the PLL_IN clock based on the received PLL_IN clock and the received high-frequency clock input CK, and if the monitored period varies from the expected period by more than a threshold, the period monitoring circuit may generate a period alert signal indicating that a shock event may have occurred in response to the monitored period having varied from the expected period by more than a threshold. The threshold may be about one of 1.0%, 1.3%, 1.6%, 1.9%, 2.2%, 2.5%, 2.8%, 3.1%, 3.4%, 3.7%, 4%, or another % of the expected period. In some embodiments, the threshold is configurable, for example, during a test operation or during a calibration operation. In some embodiments, the threshold for generating the period alert signal when the monitored period is greater than the expected period is different from the threshold for generating the period alert signal when the monitored period is less than the expected period.

In some embodiments, the PLLSTAT signal may be generated based at least partly on a change rate of the period the PLL_IN clock. For example, while the circuit is functioning without shock events, the PLL_IN clock has a particular expected period change rate. For example, the expected period may be 5%/period. In some embodiments, the expected period change rate is different from 5%/period. PLL monitor circuit 410 may include a period change rate monitoring circuit configured to monitor the period change rate of the PLL_IN clock based on the received PLL_IN clock and the received high-frequency clock input CK, and if the monitored period change rate is greater than the expected period change rate by more than a threshold, the period change rate monitoring circuit may generate a period change rate alert signal indicating that a shock event may have occurred in response to the monitored period change rate being greater than the expected period by more than a threshold. The threshold may be about one of 1.0%, 1.3%, 1.6%, 1.9%, 2.2%, 2.5%, 2.8%, 3.1%, 3.4%, 3.7%, 4%, or another % of the expected period change rate. In some embodiments, the threshold is configurable, for example, during a test operation or during a calibration operation.

In some embodiments, the PLLSTAT signal may be generated based at least partly on a phase difference between the PLL_IN clock and PLL_FB clock. For example, while the circuit is functioning without shock events, the phase difference between the PLL_IN clock and PLL_FB clock has a particular expected value. For example, the phase difference between the PLL_IN clock and PLL_FB clock may be 0 ns. In some embodiments, the expected phase difference between the PLL_IN clock and PLL_FB clock is different from 0 ns. PLL monitor circuit 410 may include a phase difference monitoring circuit configured to monitor the phase difference between the PLL_IN clock and PLL_FB clock based on the received PLL_IN clock, the received PLL_FB clock, and the received high-frequency clock input CK, and if the monitored phase difference varies from the expected phase difference by more than a threshold, the phase difference monitoring circuit may generate a phase difference alert signal indicating that a shock event may have occurred in response to the monitored phase difference having varied from the expected phase difference by more than a threshold. The threshold may be a particular number of clock cycles. For example, the threshold may be 1, 2, 3, 4, 5, 10, 20, or another number of clock cycles. In some embodiments, the threshold may be about one of 1 ns, 2 ns, 3 ns, 4 ns, 5 ns, 6 ns, 7 ns, 8 ns, 9 ns, 10 ns, 11 ns, 12 ns, 13 ns, 14 ns, 15 ns, or another time. In some embodiments, the threshold for generating the phase difference alert signal when the monitored phase difference is greater than the expected phase difference is different from the threshold for generating the phase difference alert signal when the monitored phase difference is less than the expected phase difference.

In some embodiments, other characteristics or parameters of the PLL_IN clock are monitored and corresponding alert signals indicating that a shock event may have occurred generated. For example, PLL monitor circuit 410 may include circuits which monitor any one or more of the following: jitter of the PLL_IN clock, amplitude of the PLL_IN clock, rise time of one or more edges of the PLL_input clock, fall time of one or more edges of the PLL_input clock, and another characteristic or parameter of the PLL_IN clock. In some embodiments, the PLL monitor circuit 410 additionally or alternatively receives a lock signal from the PLL circuit generating the PLL_IN clock and the PLL_FB clock, and generates a lock alert signal indicating that a shock event may have occurred in response to the PLL circuit indicating that the PLL circuit is no longer locked.

In some embodiments, PLL monitor circuit 410 generates a PLLSTAT signal indicating that a shock event may have occurred in response to any particular one of the alert signals indicating that a shock event may have occurred. In some embodiments, PLL monitor circuit 410 generates a PLLSTAT signal indicating that a shock event may have occurred in response to a particular first alert signal and, additionally, any one of the other alert signals indicating that a shock event may have occurred. In some embodiments, PLL monitor circuit 410 generates a PLLSTAT signal indicating that a shock event may have occurred in response to any two or more of the alert signals indicating that a shock event may have occurred.

Figure 5:
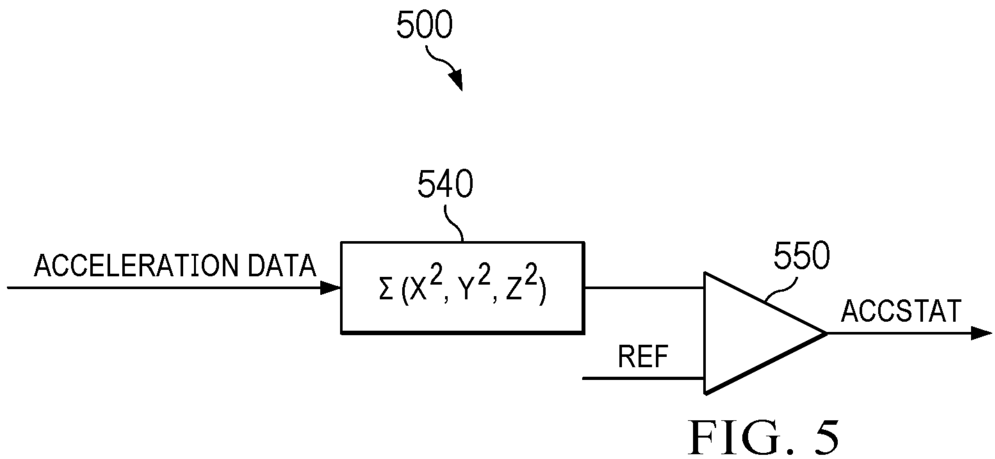
FIG. 5 shows a schematic circuit diagram of a high acceleration monitor circuit according to some embodiments.

FIG. 5 shows a schematic circuit diagram of an acceleration monitor circuit 500 according to some embodiments. Acceleration monitor circuit 500 may be used as acceleration monitor 320 in shock recovery circuit 300. In some embodiments, shock recovery circuit 300 uses another acceleration monitor circuit, for example, having characteristics similar or identical to those of acceleration monitor circuit 500. Acceleration monitor circuit 500 includes processor circuit 540, and comparator circuit 550.

Processor circuit 540 receives acceleration signals from an accelerometer sensor, such as accelerometer sensor 180. Processor circuit 540 is configured to calculate the mathematical square of each of the acceleration signals, and to generate an overall acceleration signal based on the sum of the calculated mathematical squares.

Comparator circuit 550 is configured to receive the overall acceleration signal from processor circuit 540. In addition, comparator circuit receives a reference value corresponding with an acceleration threshold. In some embodiments, the acceleration threshold is configurable, for example, during a test operation or during a calibration operation. Comparator circuit 550 is configured to compare the overall acceleration signal with the reference value. In response to the overall acceleration signal being greater than the reference value, comparator circuit 550 generates an acceleration status signal ACCSTAT indicating that a shock event may have occurred. In response to the overall acceleration signal being less than the reference value, comparator circuit 550 generates an acceleration status signal ACC-STAT not indicating that a shock event may have occurred.

In some embodiments, acceleration monitor circuit 500 is configured to be used with a mechanical oscillating sensor which is sensitive to shock events in only two spatial dimensions. In such embodiments, acceleration monitor circuit 500 includes accelerometers 510 and 520, processor circuit 540, and comparator circuit 550, where accelerometers 510 and 520 are sensitive to accelerations in the two spatial dimensions to which the mechanical oscillating sensor is sensitive.

In addition, in such embodiments, processor circuit 540 receives the acceleration signals from accelerometers 510 and 520. Processor circuit 540 is configured to calculate the mathematical square of each of the received acceleration signals, and to generate an overall acceleration signal based on the sum of the calculated mathematical squares.

Furthermore, comparator circuit 550 is configured function similarly or identically to that described above with reference to embodiments which use three accelerometers 510, 520, and 530.

In some embodiments, acceleration monitor circuit 500 is configured to be used with a mechanical oscillating sensor which is sensitive to shock events in only one spatial dimension. In such embodiments, acceleration monitor circuit 500 includes accelerometer 510, processor circuit 540, and comparator circuit 550, where accelerometer 510 is sensitive to accelerations in the one spatial dimension to which the mechanical oscillating sensor is sensitive.

In addition, in such embodiments, processor circuit 540 receives the acceleration signals from accelerometer 510. Processor circuit 540 is configured to calculate the mathematical square of the received acceleration signals, and to generate an overall acceleration signal based on the calculated mathematical square.

Furthermore, comparator circuit 550 is configured function similarly or identically to that described above with reference to embodiments which use three accelerometers 510, 520, and 530.

Figure 6:
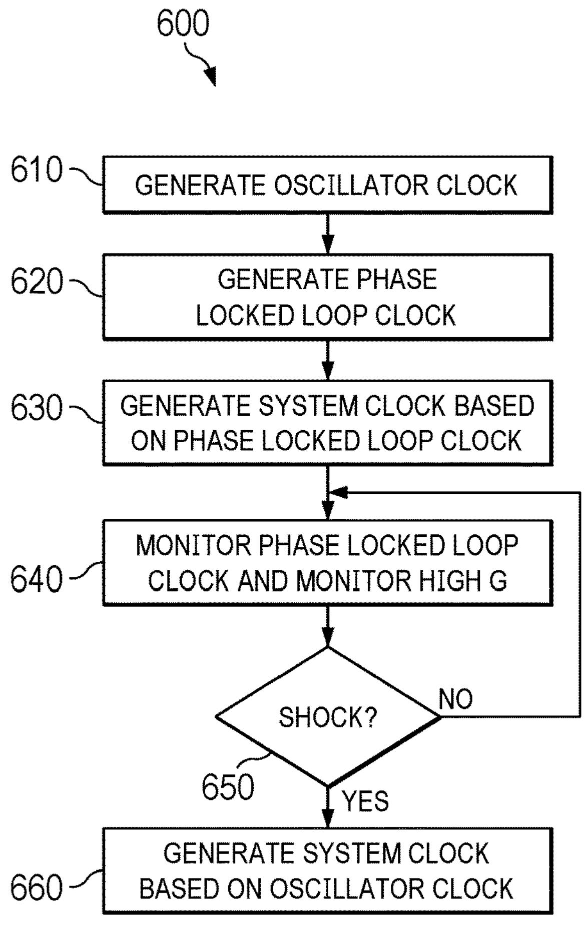
FIG. 6 shows a flowchart diagram of a method of using a clock generation system according to some embodiments.

FIG. 6 shows a flowchart diagram of a method 600 of using a clock generation system according to some embodiments. Method 600 may be performed for example by a system such as clock generation system 100. In some embodiments, clock generation system 100 is configured to perform another method having various aspect similar or identical to those of method 600.

At block 610, an oscillator clock is generated. For example, an oscillator circuit, such as oscillator circuit 110, may generate an oscillator clock, such as CKOSC. The clock generated at block 610 may be generated, for example with an electronic oscillator, such as any of a number of ring oscillator circuit architectures, or another electronic oscillator circuit.

At block 620, a PLL clock is generated. For example, a PLL, such as PLL 120, may generate a PLL clock, such as PLL clock CKPLL. The clock generated at block 620 may be generated, for example, with a PLL receiving an input clock generated by a mechanical oscillating sensor, such as, mechanical oscillating sensor 140. Accordingly, the PLL clock is generated based partly on a mechanical oscillating structure.

At block 630, a system clock is generated based on the PLL clock generated at block 620. For example, the PLL clock or a derivative thereof, may be provided to a number of circuits forming an electronic circuit or system. In some embodiments, the system is or includes automotive instrumentation, a wearable device, a phone a camera, an augmented reality or virtual reality device, or another system.

At block 640, one or more characteristics or parameters of the PLL clock is monitored. In some, but not necessarily all, embodiments, at block 640, one or more acceleration signals indicating an acceleration experienced by the mechanical oscillating structure are additionally monitored. In addition, based on the monitored characteristics or parameters of the PLL clock and/or the acceleration signals, a shock signal is generated.

At block 650, if the shock signal indicates that the mechanical oscillating structure has likely not experienced a shock event, at block 640 the characteristics or parameters of the PLL clock and/or the acceleration signals continue to be monitored. Additionally, if the shock signal indicates that the mechanical oscillating structure has likely experienced shock event, at block 660, the system clock is generated based on the oscillator clock generated at 610 instead of the PLL clock generated at block 620. For example, the oscillator clock or a derivative thereof, may be provided to the circuits forming the electronic circuit or system.

Figure 7:
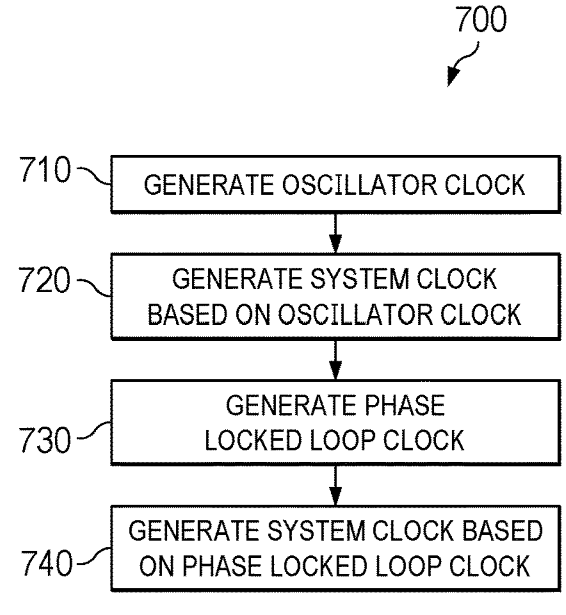
FIG. 7 shows a flowchart diagram of a method of using a clock generation system according to some embodiments.

FIG. 7 shows a flowchart diagram of a method 700 of using a clock generation system according to some embodiments. Method 700 may be performed for example by a system such as clock generation system 100. In some embodiments, clock generation system 100 is configured to perform another method having various aspect similar or identical to those of method 700.

At block 710, an oscillator clock is generated. For example, an oscillator circuit, such as oscillator circuit 110, may generate an oscillator clock, such as CKOSC. The clock generated at block 710 may be generated, for example with an electronic oscillator, such as any of a number of ring oscillator circuit architectures, or another electronic oscillator circuit.

At block 720, a system clock is generated based on the oscillator clock generated at block 710. For example, the oscillator clock or a derivative thereof, may be provided to a number of circuits forming an electronic circuit or system. In some embodiments, the system is or includes automotive instrumentation, a wearable device, a phone a camera, an augmented reality or virtual reality device, or another system.

At block 730, a PLL clock is generated. For example, a PLL, such as PLL 120, may generate a PLL clock, such as PLL clock CKPLL. The clock generated at block 730 may be generated, for example, with a PLL receiving an input clock generated by a mechanical oscillating sensor, such as, mechanical oscillating sensor 140. Accordingly, the PLL clock is generated based partly on a mechanical oscillating structure.

In some embodiments, the PLL clock generated at block 730 is generated after a shock signal has indicated that the mechanical oscillating structure has been disturbed as a result of a shock event experienced by the mechanical oscillating structure. For example, the PLL clock generated at block 730 may be generated based on the input clock from the mechanical oscillating sensor, where the PLL has been adjusting to the input clock after the shock signal.

At block 740, a system clock is generated based on the PLL clock generated at block 730. For example, the PLL clock or a derivative thereof, may be provided to the circuits forming the electronic circuit or system.

In some embodiments, the system clock generated at block 740 is generated after a shock signal has indicated that the mechanical oscillating structure has likely been disturbed as a result of a shock event experienced by the mechanical oscillating structure. For example, the system clock generated at block 740 may be generated based on the PLL clock a fixed duration or time period after the shock signal has ceased indicating that the mechanical oscillating structure has likely been disturbed. For example, in some embodiments, the system clock is generated at block 740 10 ms after the shock signal has ceased indicating that the mechanical oscillating structure has likely been disturbed. Other fixed time periods may be used. The duration of the time period should be sufficient that the input clock to the PLL and the PLL have sufficiently recovered from the shock event. In some embodiments, the system clock is generated at block 640 immediately after the shock signal has ceased indicating that the mechanical oscillating structure has likely been disturbed. In such embodiments, the shock signal ceasing to indicate that the mechanical oscillating structure has likely been disturbed provides an indication that the input clock to the PLL and the PLL have sufficiently recovered from the shock event.

Examples of the present invention are summarized here. Other examples can also be understood from the entirety of the specification and the claims.

Example 1. Another embodiment is a shock recovery circuit, including a phase locked loop (PLL) monitor circuit, the PLL monitor circuit configured to receive at least one of a PLL input clock and a PLL feedback clock, and to generate a PLL status signal based on at least one of the PLL input clock and the PLL feedback clock, the PLL status signal indicating whether a shock event has occurred; an acceleration monitor circuit, the acceleration monitor circuit configured to receive acceleration data, and to generate an acceleration status signal based on the acceleration data, the acceleration status signal indicating whether the shock event has occurred; and a controller, configured to receive the PLL status signal and the acceleration status signal, generate an enable signal indicating whether a mechanical oscillating sensor generating the PLL input clock is to operate, and generate a multiplexer signal indicating whether a system clock is to be generated based on the PLL feedback clock.

Example 2. The shock recovery circuit of example 1, where the PLL monitor circuit is configured to monitor a duty cycle of the PLL input clock, and, in response to at least one of the monitored duty cycle varying from an expected duty cycle by more than a threshold or the monitored duty cycle change rate varying from an expected duty cycle change rate by more than a threshold, to generate a duty cycle alert signal indicating the shock event.

Example 3. The shock recovery circuit of example 1, where the PLL monitor circuit is configured to monitor a period of the PLL input clock, and, in response to at least one of the monitored period varying from an expected period by more than a threshold or the monitored period change rate varying from an expected period change rate by more than a threshold, to generate a period alert signal indicating shock event.

Example 4. The shock recovery circuit of example 1, where the PLL monitor circuit is configured to monitor a phase difference between the PLL input clock and the PLL feedback clock, and, in response to the monitored phase difference varying from an expected phase difference by more than a threshold, to generate a phase difference alert signal indicating the shock event.

Example 5. The shock recovery circuit of example 1, where the acceleration monitor circuit includes a processor circuit configured to receive first, second, and third acceleration signals each indicating an acceleration in one of three orthogonal spatial dimensions, to calculate a mathematical square of each of the acceleration signals, and to generate an overall acceleration signal based on a sum of the calculated mathematical squares; and a comparator circuit configured to receive the overall acceleration signal from the processor circuit, and to receive a reference value corresponding with an acceleration threshold, and further configured to compare the overall acceleration signal with the reference value, and in response to the overall acceleration signal being greater than the reference value, generate the acceleration status signal indicating the shock event.

Example 6. The shock recovery circuit of example 1, where the controller is configured to, in response to the PLL status signal indicating the shock event, generate the enable signal indicating that the mechanical oscillating sensor is to not operate.

Example 7. The shock recovery circuit of example 1, where the controller is configured to, in response to the acceleration status signal indicating the shock event, generate the enable signal indicating that the mechanical oscillating sensor is to not operate.

Example 8. Another embodiment is a clock generation system, including an oscillator circuit configured to electronically generate an oscillator clock; a mechanical oscillating sensor including a mechanical oscillator, and configured to generate a PLL input clock; a phase locked loop (PLL) configured to receive the PLL input clock, and to generate a PLL clock and a PLL feedback signal based on the PLL input clock; a clock multiplexer configured to conditionally connect the PLL clock and the oscillator clock to an output for a system clock; an acceleration sensor configured to sense an acceleration in each of one, two or three orthogonal spatial dimensions, and to generate acceleration measurements for each of the sensed spatial dimensions; and a shock recovery circuit, configured to receive one or more of the PLL input clock, the PLL feedback signal, and the acceleration measurements, and to generate a multiplexor control signal configured to cause the clock multiplexer to connect a particular one of the PLL clock and the oscillator clock to the output based on one or more of the PLL input clock, the PLL feedback signal, and the acceleration measurements, where the multiplexor control signal causes the clock multiplexer to connect the oscillator clock to the output in response to one or more of the received PLL input clock, the received PLL feedback signal, and the received acceleration measurements indicating a shock event.

Example 9. The clock generation system of example 8, where the shock recovery circuit includes a duty cycle monitoring circuit configured to monitor a duty cycle of the PLL input clock, and, in response to at least one of the monitored duty cycle varying from an expected duty cycle by more than a threshold or the monitored duty cycle change rate varying from an expected duty cycle change rate by more than a threshold, to generate a duty cycle alert signal indicating the shock event.

Example 10. The clock generation system of example 8, where the shock recovery circuit is configured to monitor a period of the PLL input clock, and, in response to at least one of the monitored period varying from an expected period by more than a threshold or the monitored period change rate varying from an expected period change rate by more than a threshold, to generate a period alert signal indicating shock event.

Example 11. The clock generation system of example 8, where the shock recovery circuit is configured to monitor a phase difference between the PLL input clock and the PLL feedback signal, and, in response to the monitored phase difference varying from an expected phase difference by more than a threshold, to generate a phase difference alert signal indicating the shock event.

Example 12. The clock generation system of example 8, where the acceleration sensor includes first, second, and third accelerometers each configured to monitor an acceleration in one of three orthogonal spatial directions, and each configured to generate a corresponding acceleration measurement indicating the monitored acceleration.

Example 13. The clock generation system of example 12, where the shock recovery circuit includes a processor circuit configured to receive the acceleration measurements from the first, second, and third accelerometers, to calculate a mathematical square of each of the acceleration measurements, and to generate an overall acceleration signal based on a sum of the calculated mathematical squares; and a comparator circuit configured to receive the overall acceleration signal from the processor circuit, and to receive a reference value corresponding with an acceleration threshold, and further configured to compare the overall acceleration signal with the reference value, and in response to the overall acceleration signal being greater than the reference value, generate an acceleration status signal indicating the shock event.

Example 14. The clock generation system of example 8, where the shock recovery circuit is configured to, in response to the received one or more of the PLL input clock, the PLL feedback signal, and the acceleration measurements indicating the shock event, generate an enable signal indicating that the mechanical oscillating sensor is to not operate.

Example 15. The clock generation system of example 8, where the shock recovery circuit is configured to, in response to the acceleration measurements indicating that the shock event has occurred, generate an enable signal indicating that the mechanical oscillating sensor is to not operate.

Example 16. Another embodiment is a method of using a clock generation system, the method including generating an oscillator clock; generating a PLL input clock; generating a PLL clock based on the PLL input clock; generating a system clock based on the PLL clock; monitoring the PLL clock; generating a PLL status signal based on the monitored PLL clock; monitoring an acceleration of the clock generation system, and generating an acceleration status signal based on the monitored acceleration; in response to one or more of the PLL status signal and the acceleration status signal indicating a shock event, generating the system clock based on the oscillator clock; and after a delay, generating the system clock based on the PLL clock, where the delay starts with generating the system clock based on the oscillator clock.

Example 17. The method of example 16, further including generating a PLL feedback clock; and receiving one or more of the PLL input clock and the PLL feedback clock, where the PLL status signal is based on one or more of the PLL input clock and the PLL feedback clock.

Example 18. The method of example 17, where the PLL status signal is based on a duty cycle of the PLL input clock.

Example 19. The method of example 17, where the PLL status signal is based on a period of the PLL input clock.

Example 20. The method of example 17, where the PLL status signal is based on a phase difference between the PLL input clock and the PLL feedback clock.

What is claimed is:

1. A shock recovery circuit, comprising:

a phase locked loop (PLL) monitor circuit, the PLL monitor circuit configured to receive at least one of a PLL input clock and a PLL feedback clock, and to generate a PLL status signal based on at least one of the PLL input clock and the PLL feedback clock, the PLL status signal indicating whether a shock event has occurred;

an acceleration monitor circuit, the acceleration monitor circuit configured to receive acceleration data, and to generate an acceleration status signal based on the acceleration data, the acceleration status signal indicating whether the shock event has occurred; and a controller, configured to receive the PLL status signal and the acceleration status signal, generate an enable signal indicating whether a mechanical oscillating sensor generating the PLL input clock is to operate, and generate a multiplexer signal indicating whether a system clock is to be generated based on the PLL feedback clock.

2. The shock recovery circuit of claim 1, wherein the PLL monitor circuit is configured to monitor a duty cycle of the PLL input clock, and, in response to at least one of the monitored duty cycles varying from an expected duty cycle by more than a threshold or a monitored duty cycle change rate varying from an expected duty cycle change rate by more than a threshold, to generate a duty cycle alert signal indicating the shock event.

3. The shock recovery circuit of claim 1, wherein the PLL monitor circuit is configured to monitor a period of the PLL input clock, and, in response to at least one of the monitored periods varying from an expected period by more than a threshold or a monitored period change rate varying from an expected period change rate by more than a threshold, to generate a period alert signal indicating the shock event.

4. The shock recovery circuit of claim 1, wherein the PLL monitor circuit is configured to monitor a phase difference between the PLL input clock and the PLL feedback clock, and, in response to the monitored phase difference varying from an expected phase difference by more than a threshold, to generate a phase difference alert signal indicating the shock event.

5. The shock recovery circuit of claim 1, wherein the acceleration monitor circuit comprises:

a processor circuit configured to receive first, second, and third acceleration signals each indicating an acceleration in one of three orthogonal spatial dimensions, to calculate a mathematical square of each of the acceleration signals, and to generate an overall acceleration signal based on a sum of the calculated mathematical squares; and a comparator circuit configured to receive the overall acceleration signal from the processor circuit, and to receive a reference value corresponding with an acceleration threshold, and further configured to compare the overall acceleration signal with the reference value, and in response to the overall acceleration signal being greater than the reference value, generate the acceleration status signal indicating the shock event.

6. The shock recovery circuit of claim 1, wherein the controller is configured to, in response to the PLL status signal indicating the shock event, generate the enable signal indicating that the mechanical oscillating sensor is to not operate.

7. The shock recovery circuit of claim 1, wherein the controller is configured to, in response to the acceleration status signal indicating the shock event, generate the enable signal indicating that the mechanical oscillating sensor is to not operate.

8. A clock generation system, comprising:

an oscillator circuit configured to electronically generate an oscillator clock;

a mechanical oscillating sensor comprising a mechanical oscillator, and configured to generate a PLL input clock;

a phase locked loop (PLL) configured to receive the PLL input clock, and to generate a PLL clock and a PLL feedback signal based on the PLL input clock;

a clock multiplexer configured to conditionally connect the PLL clock and the oscillator clock to an output for a system clock;

an acceleration sensor configured to sense an acceleration in each of one, two or three orthogonal spatial dimensions, and to generate acceleration measurements for each of the sensed spatial dimensions; and a shock recovery circuit, configured to receive one or more of the PLL input clock, the PLL feedback signal, and the acceleration measurements, and to generate a multiplexer control signal configured to cause the clock multiplexer to connect a particular one of the PLL clock and the oscillator clock to the output based on one or more of the PLL input clock, the PLL feedback signal, and the acceleration measurements, wherein the multiplexer control signal causes the clock multiplexer to connect the oscillator clock to the output in response to one or more of the received PLL input clock, the received PLL feedback signal, and the received acceleration measurements indicating a shock event.

9. The clock generation system of claim 8, wherein the shock recovery circuit comprises a duty cycle monitoring circuit configured to monitor a duty cycle of the PLL input clock, and, in response to at least one of the monitored duty cycles varying from an expected duty cycle by more than a threshold or a monitored duty cycle change rate varying from an expected duty cycle change rate by more than a threshold, to generate a duty cycle alert signal indicating the shock event.

10. The clock generation system of claim 8, wherein the shock recovery circuit is configured to monitor a period of the PLL input clock, and, in response to at least one of the monitored periods varying from an expected period by more than a threshold or a monitored period change rate varying from an expected period change rate by more than a threshold, to generate a period alert signal indicating shock event.

11. The clock generation system of claim 8, wherein the shock recovery circuit is configured to monitor a phase difference between the PLL input clock and the PLL feedback signal, and, in response to the monitored phase difference varying from an expected phase difference by more than a threshold, to generate a phase difference alert signal indicating the shock event.

12. The clock generation system of claim 8, wherein the acceleration sensor comprises first, second, and third accelerometers each configured to monitor an acceleration in one of three orthogonal spatial directions, and each configured to generate a corresponding acceleration measurement indicating the monitored acceleration.

13. The clock generation system of claim 12, wherein the shock recovery circuit comprises:

a processor circuit configured to receive the acceleration measurements from the first, second, and third accelerometers, to calculate a mathematical square of each of the acceleration measurements, and to generate an overall acceleration signal based on a sum of the calculated mathematical squares; and a comparator circuit configured to receive the overall acceleration signal from the processor circuit, and to receive a reference value corresponding with an acceleration threshold, and further configured to compare the overall acceleration signal with the reference value, and in response to the overall acceleration signal being greater than the reference value, generate an acceleration status signal indicating the shock event.

14. The clock generation system of claim 8, wherein the shock recovery circuit is configured to, in response to the received one or more of the PLL input clock, the PLL feedback signal, and the acceleration measurements indicating the shock event, generate an enable signal indicating that the mechanical oscillating sensor is to not operate.

15. The clock generation system of claim 8, wherein the shock recovery circuit is configured to, in response to the acceleration measurements indicating that the shock event has occurred, generate an enable signal indicating that the mechanical oscillating sensor is to not operate.

16. A method of using a clock generation system, the method comprising:

generating an oscillator clock;

generating a PLL input clock;

generating a PLL clock based on the PLL input clock;

generating a system clock based on the PLL clock;

monitoring the PLL clock;

generating a PLL status signal based on the monitored PLL clock;

monitoring an acceleration of the clock generation system, and generating an acceleration status signal based on the monitored acceleration;

in response to one or more of the PLL status signal and the acceleration status signal indicating a shock event, generating the system clock based on the oscillator clock; and after a delay, generating the system clock based on the PLL clock, wherein the delay starts with generating the system clock based on the oscillator clock.

17. The method of claim 16, further comprising:

generating a PLL feedback clock; and receiving one or more of the PLL input clock and the PLL feedback clock, wherein the PLL status signal is based on one or more of the PLL input clock and the PLL feedback clock.

18. The method of claim 17, wherein the PLL status signal is based on a duty cycle of the PLL input clock.

19. The method of claim 17, wherein the PLL status signal is based on a period of the PLL input clock.

20. The method of claim 17, wherein the PLL status signal is based on a phase difference between the PLL input clock and the PLL feedback clock.

* * * * *